(12) United States Patent
Pritchard

(10) Patent No.: US 7,533,362 B1
(45) Date of Patent: May 12, 2009

(54) ALLOCATING HARDWARE RESOURCES FOR HIGH-LEVEL LANGUAGE CODE SEQUENCES

(75) Inventor: J. Orion Pritchard, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 376 days.

(21) Appl. No.: 11/385,126

(22) Filed: Mar. 20, 2006

(51) Int. Cl.
*G06F 17/50* (2006.01)

(52) U.S. Cl. ................ 716/16; 716/17; 716/18
(58) Field of Classification Search ........ 716/1, 716/3, 16–18
See application file for complete search history.

(56) References Cited

U.S. PATENT DOCUMENTS

| | | | |
|---|---|---|---|
| 5,128,871 A * | 7/1992 | Schmitz | 716/17 |
| 6,877,150 B1 | 4/2005 | Miller et al. | |
| 6,912,706 B1 | 6/2005 | Stamm et al. | |
| 7,290,228 B2 * | 10/2007 | Guenther et al. | 716/4 |
| 7,346,863 B1 * | 3/2008 | Pritchard et al. | 716/2 |
| 2004/0163072 A1 * | 8/2004 | Levy | 717/106 |

OTHER PUBLICATIONS

Celoxica, DK3, "Handel-C Language Reference Manual", 2004 http://www.celoxica.com/techlib/files/CEL-W0410251JJ4-60.pdf.

* cited by examiner

*Primary Examiner*—Vuthe Siek
(74) *Attorney, Agent, or Firm*—Weaver Austin Villeneuve and Sampson LLP

(57) ABSTRACT

Methods and apparatus are provided for implementing a programmable chip using a high-level language. Code sequences or subroutines provided in a high-level language are overloaded with information to specify the number of hardware resources such as logic elements or functional blocks used to implement the code on a programmable chip. Code sequences remain compliant with standard high-level language compilers while also being able to provide resource count information to high-level language to hardware compilers.

22 Claims, 6 Drawing Sheets

ALLOCATING HARDWARE RESOURCES FOR HIGH-LEVEL LANGUAGE CODE SEQUENCES

BACKGROUND OF THE INVENTION

1. Field of the Invention

The present invention relates to programmable chips. In one example, the present invention relates to methods and apparatus for using a high-level programming language to implement a programmable chip.

2. Description of Related Art

Some mechanisms for implementing a programmable chip entail using a general purpose programming language or high-level language. In one example, code written in a general purpose programming language such as C or C++ is converted into a hardware descriptor language (HDL) file using a tool such as the DK1 Design Suite available from Celoxica Corporation of Abingdon, England. The HDL file can then be synthesized and implemented on a programmable chip such as a programmable logic device (PLD) or a field programmable gate array (FPGA). Some available synthesis tools are Leonardo Spectrum, available from Mentor Graphics Corporation of Wilsonville, Oreg. and Synplify available from Synplicity Corporation of Sunnyvale, Calif. In many instances, it is desirable to specify the number of resources to associate with particular code sequences.

However, mechanisms for efficiently specifying the number of resources to use with various codes sequences are limited. It is therefore desirable to provide improved methods and apparatus for specifying hardware resource counts in high-level language programming language sequences or subroutines.

SUMMARY OF THE INVENTION

Methods and apparatus are provided for implementing a programmable chip using a high-level language. Code sequences or subroutines provided in a high-level language are overloaded with information to specify the number of hardware resources such as logic elements or functional blocks used to implement the code on a programmable chip. Code sequences remain compliant with standard high-level language compilers while also being able to provide resource count information to high-level language to hardware compilers.

In one embodiment, a technique for implementing a programmable device is provided. A high-level language program is received. The high-level language program is configured to run on a conventional central processing unit. A hardware resource count included in the high-level language program is identified. The hardware resource count is associated with a code sequence in the high-level language program. Hardware acceleration logic for implementing the code sequence using the hardware resource count is generated. The hardware resource count specifies the number of resources to use to implement the code sequence on the programmable device. Hardware acceleration logic is connected to memory on the programmable device.

In another embodiment, a computer system is provided. The computer system includes an input interface and a processor. The input interface is operable to parse a high-level language program. The high-level language program is configured to run on a conventional central processing unit. The input interface is operable to identify a hardware resource count included in the high-level language program. The hardware resource count is associated with a code sequence in the high-level language program. The processor is operable to generate hardware acceleration logic for implementing the code sequence using the hardware resource count. The hardware resource count specifies the number of resources to use to implement the code sequence on a programmable chip.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
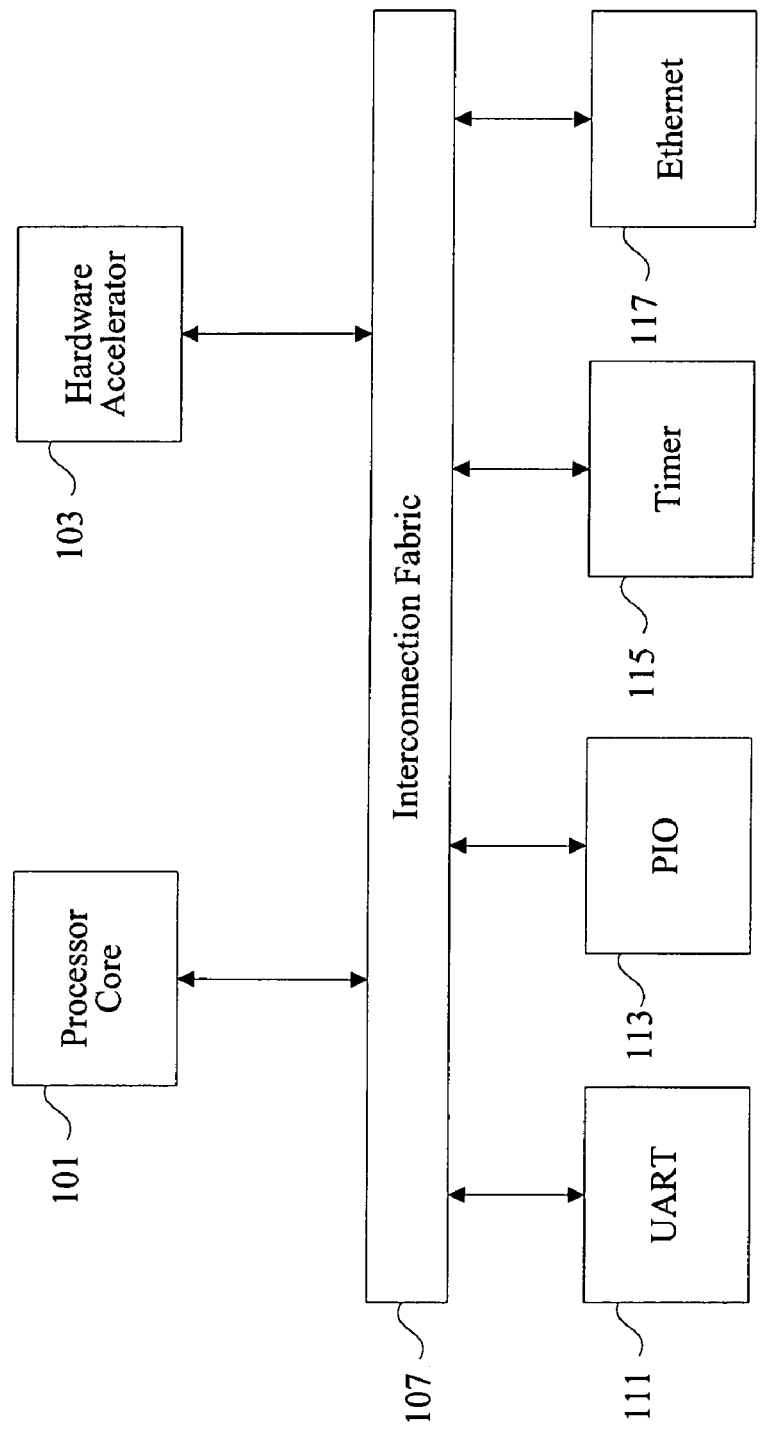
FIG. 1 is a diagrammatic representation showing a programmable device.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of programmable chips and logic elements. However, it should be noted that the techniques of the present invention can be applied to different device architectures and a variety of resources. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Furthermore, techniques and mechanisms of the present invention will sometimes be described in singular form for clarity. However, it should be noted that some embodiments can include multiple iterations of a technique or multiple instantiations of a mechanism unless noted otherwise. For example, a processor is used in a variety of contexts. However, it will be appreciated that multiple processors can also be used while remaining within the scope of the present invention.

Programmable chips include a variety of resources that can be allocated for different operations. In some examples, programmable chips include logic elements, preconfigured logic blocks, memory, and processor cores. A computer with a processor core, memory, local area network (LAN) interface, and a universal asynchronous receiver transmitter (UART) can be implemented on a single programmable device such as an FPGA. The programmable device can also include customized logic for performing specialized functions for optimizing a particular application. In one example, logic elements are allocated for implementing a digital signal processing (DSP) core for performing Fast Fourier Transform (FFT) operations. In another example, logic elements are allocated for optimizing video rendering functions.

Designers have a variety of options available for implementing a system on a programmable device. In typical instances, the designer provides both a hardware and a software design. A hardware design can be used to implement a particular hardware accelerator on the programmable device. Software can run on a general-purpose processor included on the device. Any logic or mechanisms supporting a general-purpose instruction set such as a reduced instruction set computing (RISC) instruction set, a complex instruction set computing (CISC), or a very long instruction word (VLIW), instruction set is referred to herein as a general-purpose processor or a central processing unit. Conventional processors include the Xeon line of processors available from Intel Corporation of Santa Clara, Calif. and the Opteron line of processors available from AMD of Sunnyvale, Calif. Conventional processing cores available for implementation on a system on a chip (SOC) or a system on a programmable chip (SOPC) include the ARM line of processor cores available from ARM Ltd. of Cambridge, England.

A system on a programmable chip typically includes logic implemented using a Hardware Description Language (HDL). However, using HDL may not be a very efficient or effective way of optimizing an application optimized programmable chip. HDL often requires knowledge about the underlying hardware, and relatively few people have familiarity with HDL.

Other languages for implementing logic on a device have been developed based on high-level programming languages. Any language that can be used to describe software functions and/or objects without extensive knowledge of the underlying hardware used to implement the software is referred to herein as a high-level language. Examples of high-level languages include C, C++, Java, and Pascal conventionally used by software engineers. Other variations include Matlab and VisualBasic. High-level languages are typically general purpose and interact with hardware using operating system associated application program interfaces (APIs).

The high-level language includes mechanisms for implementing function calls. The high-level language description is compiled into a generic sequential flow by parsing, building a symbol table, and generating a generic sequential flow using typical compiler techniques. Some tools including HDL Designer available from Mentor Graphics Corporation of Wilsonville, Oreg. and the DK1 Design Suite available from Celoxica of Abingdon, England provide high-level language like syntax, typically C-like syntax, for implementing a portion of a program in hardware while leaving the rest as a software implementation. However, tools that provide high-level language like syntax for implementing hardware on a programmable device have significant drawbacks.

One tool providing C-like syntax is Celoxica's DK1 Design Suite that uses a language referred to as Handel-C. Although Handel-C looks like C to a software engineer, there are significant differences. In order to use Handel-C, a software engineer has to go through extra training about hardware-specific concepts such as clock cycles, parallelism, and bit widths. When a software engineer wants to implement specific code using hardware acceleration, the engineer is required to determine what portion should be accelerated. Even determining what to accelerate often requires knowledge of the underlying hardware. The software engineer then typically has to make specific hardware calls in code sequences. One or more lines of software code are referred to herein as a code sequence. In one example, a code sequence is a subroutine and can be included in one or more files. Specific Handel-C syntax is used to allocate resources. For example, an array value can be used to specify the number of resources to allocate for a function in the following manner:

int MAC[23](int a, int b, int lastMac) { }

Although specifying the number of resources using an array value is an elegant way to allocate resources, it is not standard high-level programming language or ANSI C compliant. Consequently, a program written in Handel-C can not operate on any other system. For example, a Handel-C program can not be run completely using a general purpose processor such as an ARM processor core, as the ARM processor core would not understand resource allocation syntax. Similarly, a Handel-C program could not run on many available simulators for the same reason.

Consequently, the techniques of the present invention allow a user to specify the number of hardware resources to use for a particular code sequence while keeping a program compliant with conventional high-level language syntax. For example, the number of resources to allocate for a particular function can be specified in a manner that allows the program to remain ANSI C compliant. A C to gates or C to hardware compiler would recognize particular hardware syntax such as resource allocation syntax while a software compiler would not be adversely affected. The techniques of the present invention allow the implementation of high-level language programs onto a variety of devices.

FIG. 1 is a diagrammatic representation showing one example of a system on a programmable chip that can be implemented using high-level language programs. The system includes a processor core, a hardware accelerator, peripheral devices, and peripheral interfaces. Peripheral devices and peripheral interfaces are herein referred to as components. The system on a programmable chip includes processor core 101 and a hardware accelerator 103 as well as peripheral components UART 111, PIO 113, timer 115, and data memory 117. In some examples, the hardware accelerator 103 is a Digital Signal Processing (DSP) core, a cryptography accelerator, or a video processor. It should be noted that the system can include both on-chip memory 117 and off-chip memory. In one example, the data memory 117 can support variable latency or fixed latency access. The components are interconnected using an interconnection fabric 107. Any mechanism or logic for connecting components in a system is referred to herein as an interconnection fabric. In one example, the interconnection fabric is a bus. In another example, the interconnection fabric is a secondary side arbitration fabric.

The programmable chip uses different types of resources that can be interchangeably used in different allocations to implement the system on a programmable chip. In one example, the programmable chip uses logic elements for implementing each of the various components on the programmable chip. Some programmable chips also include preconfigured logic blocks as resources that can be allocated in different manners to run various subroutines.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

A variety of techniques can be used to specify resource counts. For example, graphical user interfaces (GUIs), eXtensible Markup Language (XML) HDL files, and modifications to high-level programming languages can be used to assign resource counts to various code sequences. However, using GUIs or XML files entails an extra level of programming complexity. Additional files have to be associated with high-level language programming files such as a file including C code. Modification to the C programming language creates incompatibilities with standard compilers, processors, systems, and simulation tools.

The techniques and mechanisms of the present invention allow the implementation of a system on a programmable chip from a high-level language program that provides a designer with the ability to allocate resources. The high-level language program remains compliant with general purpose high-level language programming language standards. The same code can be used with existing software design flows and with high-level programming language to hardware generation. Support for general purposes processors running under a variety of development environments is provided.

According to various embodiments, shared hardware resources are typically described as subroutines. For example, the following code would provide resources for implementing a multiply accumulate function:

```
int MAC (int a, int b, int lastMac)
{
return lastMac + a * b;
}
```

To allow parallelism, the subroutine is duplicated multiple times by overloading a variable name to include additional information. For example, the following code would provide resources for implementing multiple MAC subroutines:

```
int MAC (int a, int b, int lastMac, RESOURCE_COUNT i)
    {MAX_RESOURCES x = 23;
    Return lastMac + a * b;
}
```

RESOURCE_COUNT and MAX_RESOURCES can be type defined to be integers. In a software to hardware or C to gates compiler, the RESOURCE_COUNT value would be a constant and an error would occur if the RESOURCE_COUNT were ever greater than MAX_RESOURCES.

According to various embodiments, a wrapper is provided around the hardware function call in order to specify generation of the hardware using the RESOURCE_COUNT value. The RESOURCE_COUNT value is one example of a resource count parameter that can be used to specify the amount or number of hardware resources to use for any given code sequence. In one example, the resource count parameter specifies the number of logic elements or preconfigured logic blocks to use for a subroutine written in ANSI C. A wrapper can provide a looping mechanism to create multiple shared resources to allow parallelism. For example, the following code sequence can be used to specify generation of the hardware.

```
register int result[23], a[23], b[23];
for (RESOURCE_COUNT x = 0; x<23; x++) {
result[x] = MAC (a[x], b[x], result[x], x);
}
```

The code sequence would result in 23 parallel multiply accumulate (MAC) values calculated using 23 logic blocks implemented on a programmable device.

In another example, the following code could be used to allow tuning of resource usage:

```
#define MAC_AMOUNT 93
#define MAC_RESOURCES 18
int MAC (int a, int b, int lastMac, RESOURCE_COUNT i)
{
MAX_RESOURCES x = MAC_RESOURCES;
return lastMac + a * b;
}
int call_MAC( )
{
register int result[MAC_AMOUNT], a[MAC_A-
    MOUNT], b[MAC_AMOUNT];
RESOURCE_COUNT x;
for (int i=0; i<MAC_AMOUNT; i++)
{
    result[i] = MAC (a[i], b[i], result[i], 1% MAC_RE-
        SOURCES);
}
}
```

The MAC_AMOUNT value can be tuned to adjust resource usage based on user preferences. The for-loop calculation which calls a subroutine in this fashion should have values in the (1% MAC_RESOURCES) that can be determined at compile time. If the value can not be determined, enough arbitration logic will be generated to allow the function to be dispatched to the correct function. If values can be determined for each input to the function at compile time, compiler optimization will "lift" the function out of the for loop and generate loops which mux MAC_AMOUNT of registers into MAC_RESOURCES for all a[i], b[i], result[i].

According to various embodiments, no modification to the C programming language is required. The code works with a variety of processors and existing software and hardware design flows. It is recognized that software compilers will sometimes show warnings because various parameters appear to be unused. Parameters such as resource count parameters that have meaning to a C to gates or C to hardware compilers will appear extraneous in a software compilers. However, the techniques of the present invention recognize that compiler warnings can be removed with additional code to have the values included in some operation or the warnings can be ignored entirely.

Figure 2:
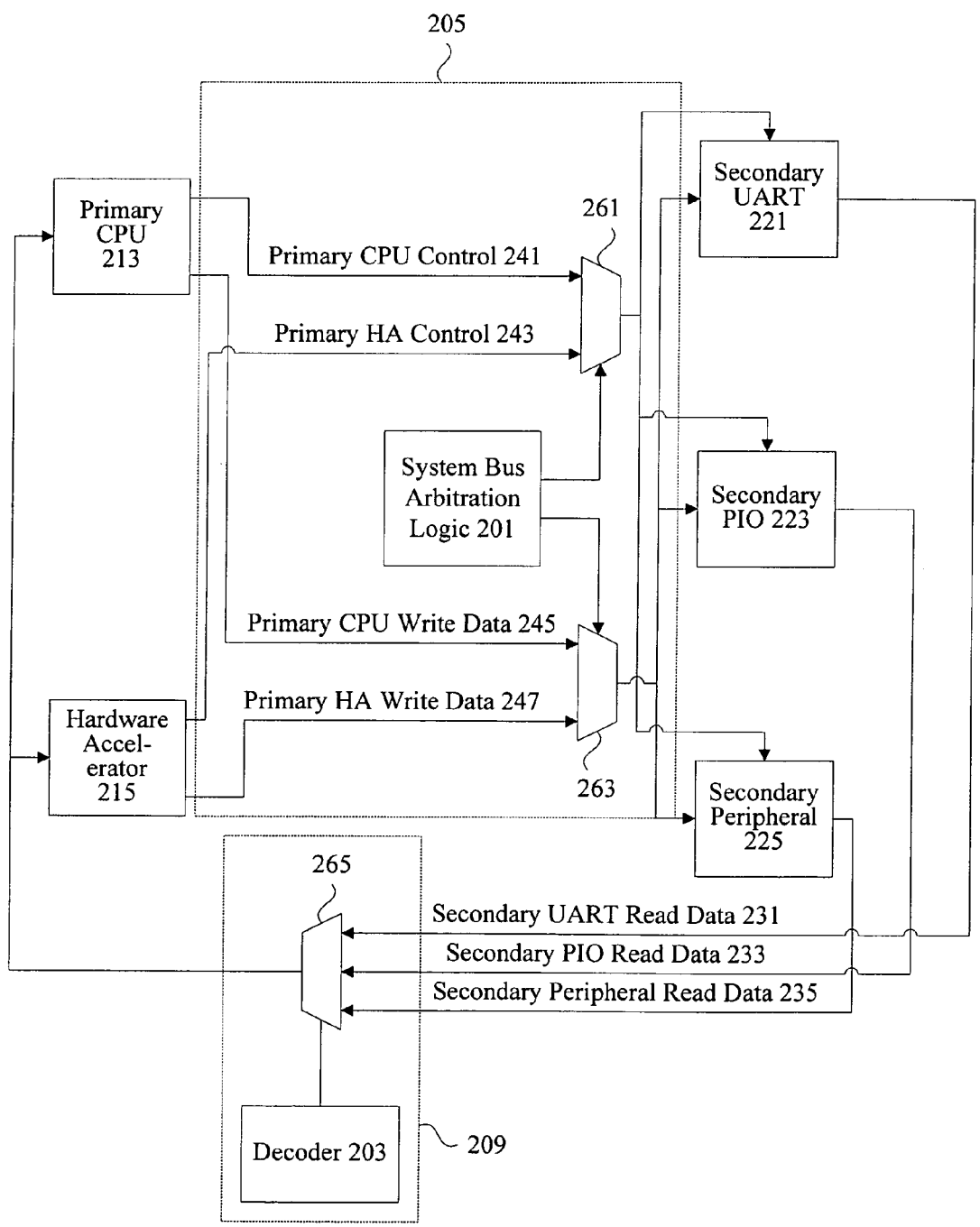
FIG. 2 is a diagrammatic representation showing a conventional bus architecture.

FIG. 2 is a diagrammatic representation depicting a hardware accelerator coupled to a microprocessor in a system using a conventional bus architecture. Although the techniques of the present invention provide significant performance benefits on a system having a secondary component side arbitration, the techniques can also be used to implement other systems such as conventional system bus implementations.

A conventional bus architecture includes a system bus arbitrator 205. A system bus arbitrator 205 includes arbitrator switching circuitry 261 and 263 as well as system bus arbitration logic 201. Logic and mechanisms for selecting an input based on a bus control signal are referred to herein as arbitration logic. It should be noted that although switching circuitry generally can be implemented using multiplexers, a variety of mechanisms including switches and transistors can be used.

Any component or device that is operable to initiate read and write operations by providing control information is referred to herein as a primary component. Primary components are sometimes referred to as master components. Control information can include a particular address associated with a secondary component. Any component or device that responds to read or write operations with information sent back to the primary component regarding the read or write operation is referred to herein as a secondary component. Secondary components are sometimes referred to as slave components. Some examples of primary components are processors, microcontrollers, and Ethernet devices. Some examples of secondary components are Universal Asynchronous Receiver Transmitters (UARTs), Parallel Input Output (PIO), program memory, and data memory. It should be noted that some components such as an Ethernet component can be both a primary component and a secondary component, as an Ethernet component has the capability of reading and writing to the secondary program memory while also responding to instructions from a primary system CPU.

Logic and mechanisms for providing the control signal based on criteria such as fairness or priority are referred to herein as arbitration logic. The inputs of the arbitrator switching circuitry 261 and 263 are connected to primary CPU 213 and hardware accelerator 215. The outputs of the arbitrator switching circuitry 261 and 263 are connected to secondary UART 221, secondary PIO 223, and secondary peripheral interface 225. The outputs of the secondary components transmit information such as read data back to the primary components through a decoder 209. Mechanisms for selecting secondary components and translating control information such as addresses is referred to herein as a decoder. In conventional computer systems, there is a single decoder for each bus. A decoder 209 includes decoder logic 203 and decoder switching circuitry 265 for selecting the particular secondary component data transfer. A decoder can also be referred to as a primary side arbitrator including primary side arbitration logic and primary side switching circuitry.

A system bus typically has a set width (e.g. 64 bits, 128 bits) and allows only one primary component to actively use the bus at any one time. In conventional systems, only one primary component can access any one of the given secondary components and any given time. Multiple primary components accessing secondary components in a manner that would cause data bit collisions if performed on the same data lines is referred to herein as accessing secondary components at the same time.

In one example, a hardware accelerator is accessing a secondary PIO. While the hardware accelerator is accessing the secondary PIO, a processor can not access an SDRAM through a peripheral interface even if both the primary streaming output device and the peripheral interface are available.

The system bus arbitration logic 201 determines which primary component has access to the system bus at any time. The system bus arbitrator 201 can determine which primary component can access a secondary component based on criteria such as fairness or priority. Any component or device that is configured to ensure that only one primary component can access any one of the secondary components at any given time is referred to herein as a system bus arbitrator or bus arbitration logic. Various schemes such as weighted fairness can be implemented to improve the efficiency of secondary component access, but such schemes can increase system complexity and latency. In conventional implementations, a computer system includes a single system bus arbitrator for each bus in the computer system.

According to various embodiments, it is recognized that a bus is no longer required in certain applications such as system on a chip, system on a programmable chip, and other computer system implementations. A device such as a programmable logic device (PLD) or a field programmable gate array (FPGA) using a hardware descriptor language (HDL) is herein referred to as a programmable chip or a programmable device. Instead of implementing complicated bus sharing schemes using mechanisms such as splitting, performance can be improved using slave side arbitration.

According to specific embodiments, it is recognized that primary components and secondary components need not be routed through a construct such as a bus. By not routing signals through a bus, a streaming output device can be implemented in a much more efficient manner. The conventional data and address lines that make up the bus are no longer the resource in contention. Instead, secondary components are resources in contention, as the number of physical lines connected to each secondary component in a system can be fixed. Furthermore, by not using a bus, interconnection flexibility is enhanced.

Consequently, a system bus arbitrator associated with all the secondary components in a computer system is no longer needed. Instead, secondary components themselves that may be accessed by more than one primary component are assigned individual secondary side arbitrators. An arbitrator that corresponds to a specific secondary component accessible by more than one primary component is referred to herein as a secondary side arbitrator or slave side arbitrator. In one embodiment, there is a secondary side arbitrator for each secondary component in a computer system. In other embodiments, there is a secondary side arbitrator for selected secondary components in a system. The techniques of the present invention recognize that both primary side arbitration and secondary side arbitration can benefit from more efficient bus arbitration logic.

Figure 3:
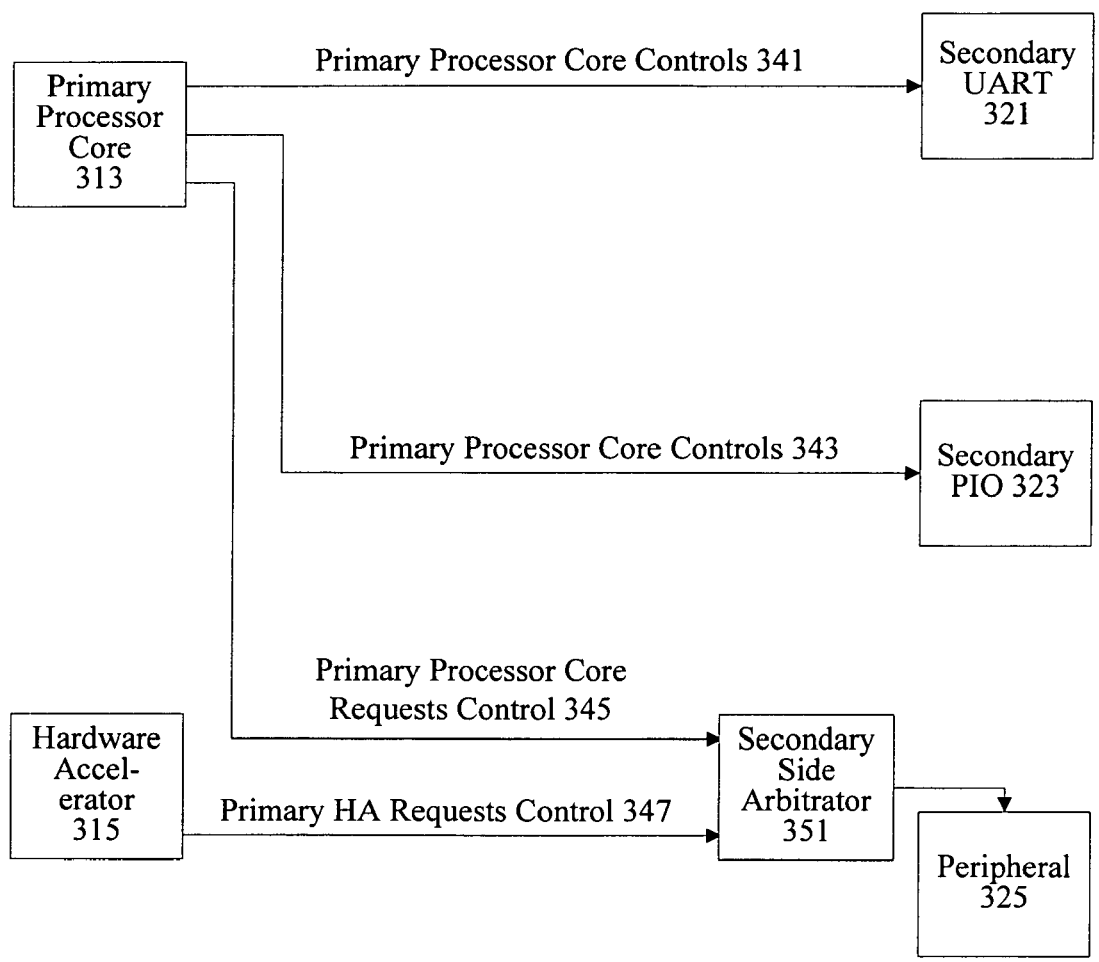
FIG. 3 is a diagrammatic representation showing an interconnection fabric.

FIG. 3 is a diagrammatic representation showing one example of a system using secondary side arbitration, sometimes referred to as slave side arbitration, simultaneous multiple primary components, or simultaneous multiple masters. A system using individual arbitrators that correspond to individual secondary components accessible by more than one primary component is referred to herein as a secondary side arbitration system. The secondary side arbitration system no longer requires a bus or a system bus arbitrator that prevents a second primary component from accessing a second secondary component when a first primary component is accessing a first secondary component. According to various embodiments a secondary component such as peripheral interface 325 is associated with a secondary side arbitrator 351. However, secondary components UART 321 and PIO 323 are not associated with any arbitrator. In one example, secondary component UART 321 and secondary PIO 323 can only be accessed by primary CPU 313 and not by primary Ethernet device 315. A peripheral interface 325, however, can be accessed by both primary CPU 313 and primary Ethernet device 315.

According to various embodiments, a secondary side arbitrator 351 allows a first secondary component in a system to be accessed by a first primary component at the same time a second secondary component in the system is accessed by a second primary component. For example, peripheral interface 325 can be accessed by primary Ethernet 315 through secondary side arbitrator 351 at the same time, secondary UART 321 is accessed by primary CPU 313.

By allowing a CPU to access a secondary component at the same time another primary component such as a streaming output device or an Ethernet component is accessing memory, bus bottlenecks can be reduced. By using the simultaneous multiple primary component architecture, more direct connections between components can also be supported.

Although secondary side arbitrators provide many benefits to programmable chip designers, arbitration logic efficiency is still needed to prevent performance degradation. It is also beneficial to provide priority considerations and fairness with any arbitration logic, secondary side arbitration logic or otherwise.

Figure 4A:
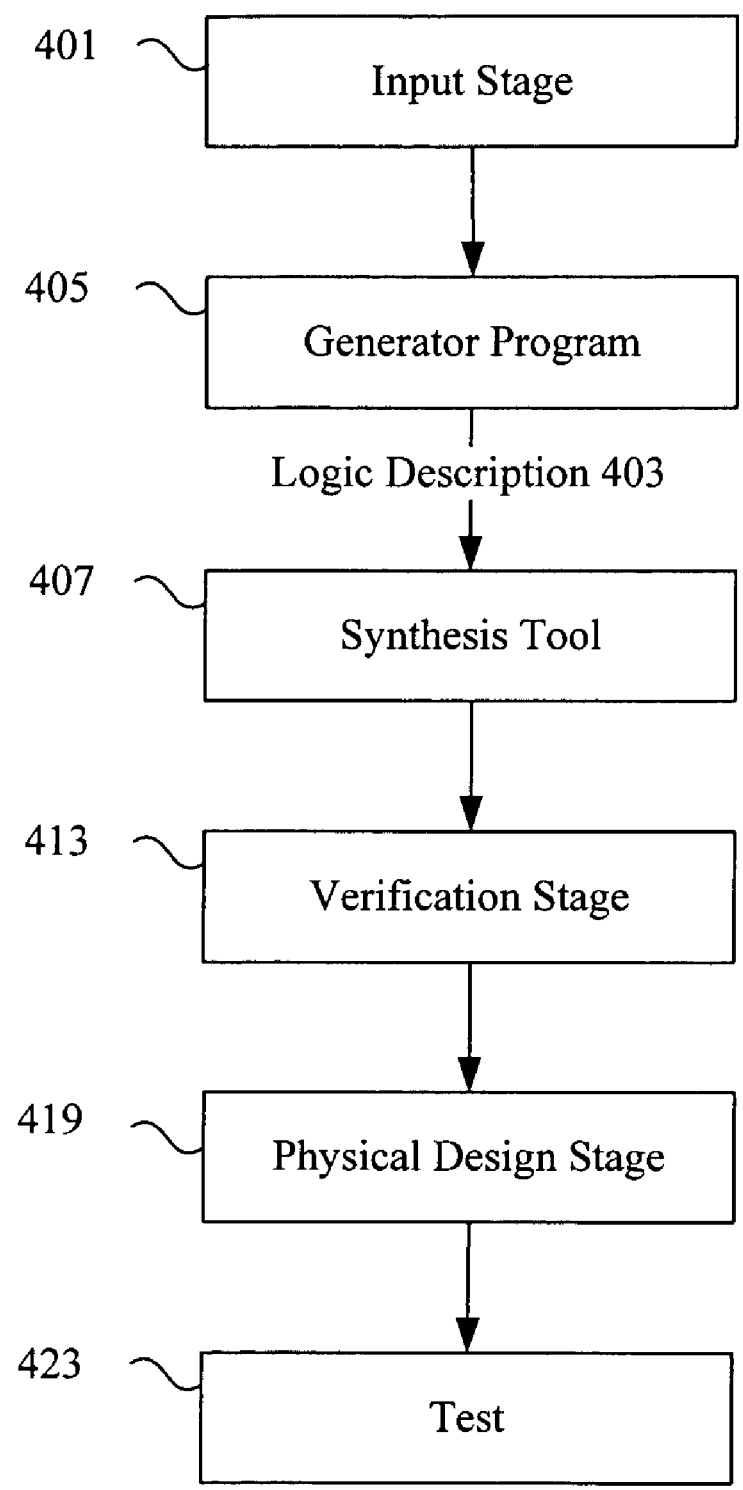
FIG. 4A is a diagrammatic representation showing a technique for implementing the programmable chip.

FIG. 4A is a diagrammatic representation showing implementation of an electronic device that can use arbitration logic according to various embodiments. An input stage 401 receives selection information typically from a user for logic such as a processor core as well as other components such as a streaming output device to be implemented on an electronic device. In one example, the input received is in the form of a high-level language program. A generator program 405 creates a logic description 403 and provides the logic description along with other customized logic to any of a variety of synthesis tools, place and route programs, and logic configuration tools to allow a logic description to be implemented on an electronic device.

In one example, an input stage 401 often allows selection and parameterization of components to be used on an electronic device. The input stage 401 also allows configuration of variable or fixed latency support. In some examples, components provided to an input stage include intellectual property functions, megafunctions, and intellectual property cores. The input stage 401 may be a graphical user interface using wizards for allowing efficient or convenient entry of information. The input stage may also be a text interface or a program reading a data file such as a spreadsheet, database table, or schematic to acquire selection information. The input stage 401 produces an output containing information about the various modules selected.

In typical implementations, the generator program 405 can identify the selections and generate a logic description with information for implementing the various modules. The generator program 405 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 405 identifies pointers and provides ports for each pointer. One tool with generator program capabilities is System on a Programmable Chip (SOPC) Builder available from Altera Corporation of San Jose, Calif. The generator program 405 also provides information to a synthesis tool 407 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 409.

As will be appreciated by one of skill in the art, the input stage 401, generator program 405, and synthesis tool 407 can be separate programs. The interface between the separate programs can be a database file, a log, or simply messages transmitted between the programs. For example, instead of writing a file to storage, the input stage 401 can send messages directly to the generator program 405 to allow the generator program to create a logic description. Similarly, the generator program can provide information directly to the synthesis tool instead of writing HDL files. Similarly, input stage 401, generator program 405, and synthesis tool 407 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 407.

A synthesis tool 407 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 413 typically follows the synthesis stage 407. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 413, the synthesized netlist file can be provided to physical design tools 419 including place and route and configuration tools. A place and route tool typically locates logic cells on specific logic elements of a target hardware device and connects wires between the inputs and outputs of the various logic elements in accordance with logic required to implement an electronic design. The device can also be physically tested at 423.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 401, the generator program 405, the synthesis tool 407, the verification tools 413, and physical design tools 419 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 4B:
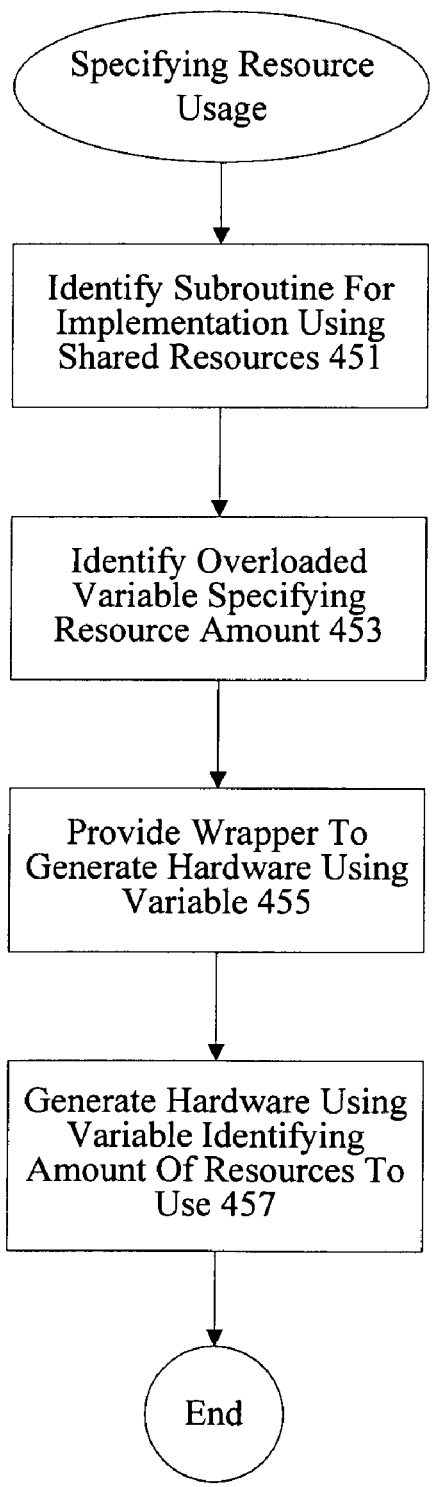
FIG. 4B is a flow process diagram showing a technique for specifying resource usage.

FIG. 4B is a flow process diagram showing a technique for specifying resource usage. At 451, a subroutine for implementation using shared resources is identified. To allow parallelism, the subroutine is duplicated multiple times by overloading a variable name to include additional information. At 453, an overloaded variable such as a resource count variable is provided. The resource count variable does not otherwise affect synthesis and simulation tools.

In some embodiments, the overloaded variable can be type defined to be an integer. According to various embodiments, a wrapper is provided around the hardware function at 455 call in order to specify generation of the hardware using the overloaded variable such as resource count. A resource count is one example of a resource count parameter that can be used to specify the amount or number of hardware resources to use for any given code sequence. In one example, the resource count parameter specifies the number of logic elements or preconfigured logic blocks to use for a subroutine written in ANSI C. In one example, a wrapper can provide a looping mechanism at 455 to create multiple shared resources to allow parallelism. At 457, hardware can be generated using the variable identifying the amount of resources.

Figure 5:
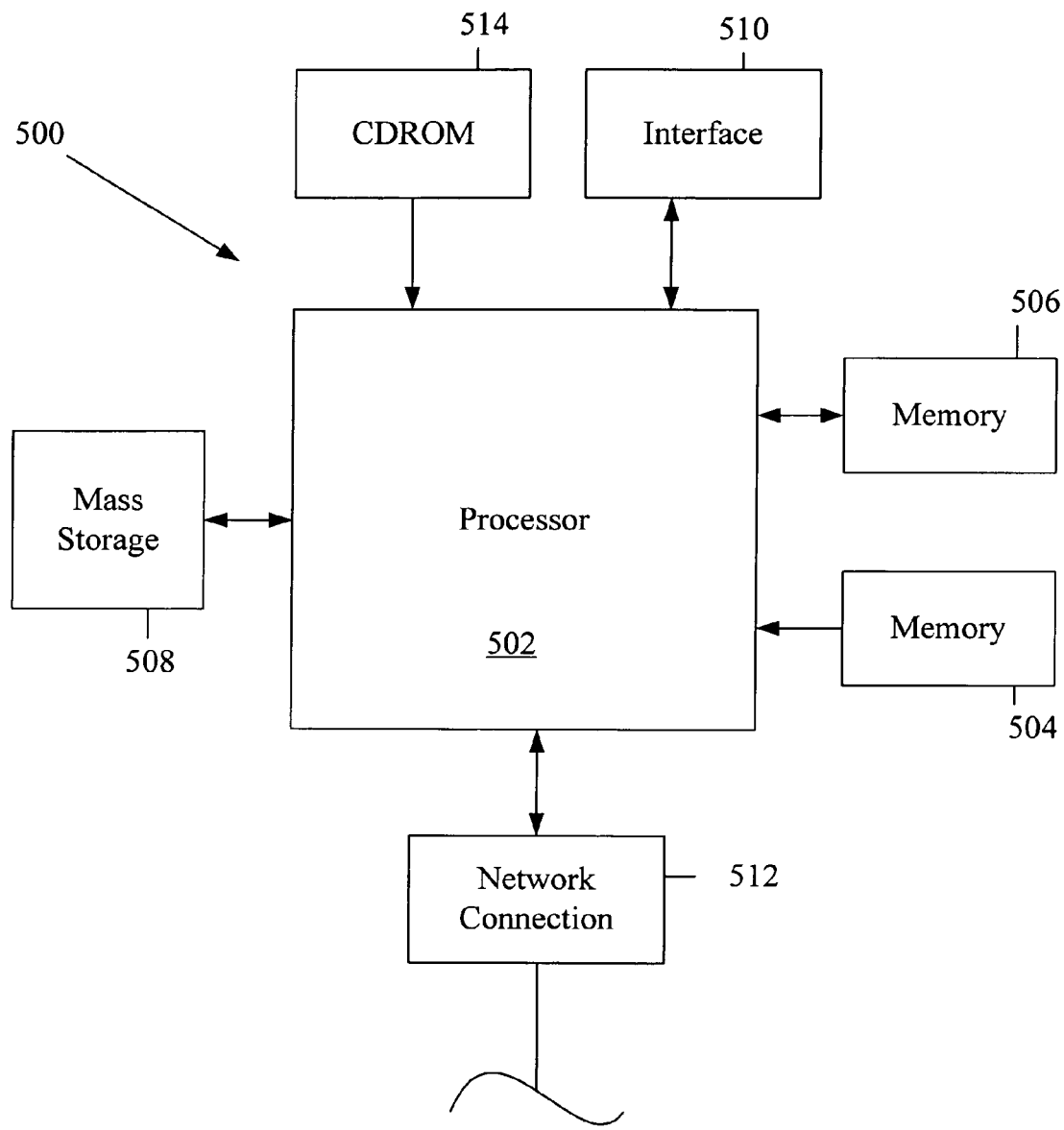
FIG. 5 is a diagrammatic representation depicting a computer system.

FIG. 5 is a diagrammatic representation showing a typical computer system that can be used to implement a programmable chip having bus arbitration with priority encoding and fairness. The computer system 500 includes any number of processors 502 (also referred to as central processing units, or CPUs) that are coupled to devices including memory 506 (typically a random access memory, or "RAM"), memory 504 (typically a read only memory, or "ROM"). The processors 502 can be configured to generate a test sequences for any designated processor. As is well known in the art, memory 504 acts to transfer data and instructions uni-directionally to the CPU and memory 506 is used typically to transfer data and instructions in a bi-directional manner.

Both of these memory devices may include any suitable type of the computer-readable media described above. A mass storage device 508 is also coupled bi-directionally to CPU 502 and provides additional data storage capacity and may include any of the computer-readable media described above. The mass storage device 508 may be used to store programs, data and the like and is typically a secondary storage medium such as a hard disk that is slower than memory. The mass storage device 508 can be used to hold a library or database of prepackaged logic or intellectual property functions, as well as information on generating particular configurations. It will be appreciated that the information retained within the mass storage device 508, may, in appropriate cases, be incorporated in standard fashion as part of memory 506 as virtual memory. A specific mass storage device such as a CD-ROM 514 may also pass data uni-directionally to the CPU.

CPU 502 is also coupled to an interface 510 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 502 optionally may be coupled to a computer or telecommunications network using a network connection as shown generally at 512. With such a network connection, it is contemplated that the CPU might receive information from the network, or might output information to the network in the course of performing the above-described method steps. It should be noted that the system 500 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 508 or 514 and executed on CPU 508 in conjunction with primary memory 506.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. Although shared I/O lines have been described in the context of a memory controller and a simultaneous multiple primary component switch fabric, shared I/O lines can be used in a system without a memory controller and/or without a simultaneous multiple primary component switch fabric. It is therefore intended that the invention be interpreted to include all variations and equivalents that fall within the true spirit and scope of the claims.

What is claimed is:

1. A method for implementing a programmable device, the method comprising:
   receiving a high-level language program, the high-level language program configured to run on a conventional central processing unit;
   identifying a hardware resource count included in the high-level language program, wherein the hardware resource count is associated with a code sequence in the high-level language program;
   generating hardware acceleration logic for implementing the code sequence using the hardware resource count, wherein the hardware resource count specifies the number of resources to use to implement the code sequence on the programmable device; and
   connecting the hardware acceleration logic to memory on the programmable device.

2. The method of claim 1, wherein the high-level language program is used by both software simulation design flows and by hardware generation flows.

3. The method of claim 2, wherein the code sequence is a subroutine.

4. The method of claim 1, wherein the hardware resource count specifies the number of logic elements used to implement the code sequence.

5. The method of claim 1, wherein the hardware resource count is associated with a maximum resource count.

6. The method of claim 1, wherein generating hardware acceleration logic includes generating HDL.

7. The method of claim 6, wherein generating hardware acceleration logic includes generating a hardware acceleration component for implementation on the programmable device.

8. The method of claim 1, wherein the central processing unit is a general purpose processor.

9. The method of claim 8, wherein the central processing unit supports a general purpose instruction set.

10. The method of claim 8, wherein the high-level language program is prepared in ANSI C.

11. The method of claim 8, further comprising providing a processor core operable as a conventional central processing unit, the processor core configured for implementation on the programmable device.

12. A computer system, comprising:
an input interface operable to parse a high-level language program, the high-level language program configured to run on a conventional central processing unit, wherein the input interface is operable to identify a hardware resource count included in the high-level language program, wherein the hardware resource count is associated with a code sequence in the high-level language program;
a processor operable to generate hardware acceleration logic for implementing the code sequence using the hardware resource count, wherein the hardware resource count specifies the number of resources to use to implement the code sequence on a programmable chip.

13. The computer system of claim 12, wherein the high-level language program is used by both software simulation design flows and by hardware generation flows.

14. The computer system of claim 13, wherein the code sequence is a subroutine.

15. The computer system of claim 12, wherein the hardware resource count specifies the number of logic elements used to implement the code sequence.

16. The computer system of claim 12, wherein the hardware resource count is associated with a maximum resource count.

17. The computer system of claim 12, wherein generating hardware acceleration logic includes generating HDL.

18. The computer system of claim 17, wherein generating hardware acceleration logic includes generating a hardware acceleration component for implementation on the programmable device.

19. The computer system of claim 12, wherein the central processing unit is a general purpose processor.

20. The computer system of claim 19, wherein the central processing unit supports a general purpose instruction set.

21. A system for implementing a programmable device, the system comprising:
means for receiving a high-level language program, the high-level language program configured to run on a conventional central processing unit;
means for identifying a hardware resource count included in the high-level language program, wherein the hardware resource count is associated with a code sequence in the high-level language program;
means for generating hardware acceleration logic for implementing the code sequence using the hardware resource count, wherein the hardware resource count specifies the number of resources to use to implement the code sequence; and
means for coupling the hardware acceleration logic to memory on the programmable device.

22. A computer readable medium comprising computer code for implementing a programmable device, the computer readable medium comprising:
computer code for receiving a high-level language program, the high-level language program configured to run on a conventional central processing unit;
computer code for identifying a hardware resource count included in the high-level language program, wherein the hardware resource count is associated with a code sequence in the high-level language program;
computer code for generating hardware acceleration logic for implementing the code sequence using the hardware resource count, wherein the hardware resource count specifies the number of resources to use to implement the code sequence; and
computer code for coupling the hardware acceleration logic to memory on the programmable device.

* * * * *